United States Patent
Murooka (10) Patent No.: US 11,107,659 B2
(45) Date of Patent: Aug. 31, 2021

(54) ION GENERATOR AND ION IMPLANTER

(71) Applicant: SUMITOMO HEAVY INDUSTRIES ION TECHNOLOGY CO., LTD., Tokyo (JP)

(72) Inventor: Hiroki Murooka, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 16/930,036

(22) Filed: Jul. 15, 2020

(65) Prior Publication Data

US 2021/0020403 A1    Jan. 21, 2021

(30) Foreign Application Priority Data

Jul. 16, 2019 (JP) .............................. JP2019-131070

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01); *H01J 2237/006* (2013.01); *H01J 2237/08* (2013.01)

(58) Field of Classification Search
None
See application file for complete search history.

(56) References Cited

U.S. PATENT DOCUMENTS

| 4,898,798 | A | * | 2/1990 | Sugata | G03G 5/08285 |
| | | | | | 430/58.1 |
| 5,808,416 | A | * | 9/1998 | Armini | H01J 27/04 |
| | | | | | 250/423 R |
| 8,253,114 | B2 | * | 8/2012 | Yamashita | H01J 27/14 |
| | | | | | 250/423 R |
| 9,187,832 | B2 | * | 11/2015 | Biloiu | H01J 37/08 |
| 10,043,635 | B2 | * | 8/2018 | Aya | H01J 27/08 |
| 2008/0047607 | A1 | * | 2/2008 | Horsky | C23C 14/48 |
| | | | | | 137/8 |
| 2008/0073559 | A1 | * | 3/2008 | Horsky | H01J 37/08 |
| | | | | | 250/428 |

FOREIGN PATENT DOCUMENTS

| JP | 2004-359985 A | 12/2004 | |
| JP | 2004359985 A | * 12/2004 | |
| JP | 2010-080429 A | 4/2010 | |
| JP | 2010080429 A | * 4/2010 | ............. H01J 27/14 |
| JP | 2014-003046 A | 1/2014 | |
| JP | 2014003046 A | * 1/2014 | |
| JP | 2016-522964 A | 8/2016 | |
| WO | WO-2016/046939 A1 | 3/2016 | |
| WO | WO-2016046939 A1 | * 3/2016 | ............. H01J 37/18 |

* cited by examiner

*Primary Examiner* — Andrew Smyth
(74) *Attorney, Agent, or Firm* — Michael Best & Friedrich LLP (57) ABSTRACT

There is provided an ion generator including a vapor generating chamber for generating a vapor by heating a raw material in which a first solid material which is a single substance of an impurity element and a second solid material which is a compound containing the impurity element are mixed with each other, and a plasma generating chamber for generating a plasma containing ions of the impurity element by using the vapor.

18 Claims, 3 Drawing Sheets

ION GENERATOR AND ION IMPLANTER

RELATED APPLICATIONS

The content of Japanese Patent Application No. 2019-131070, on the basis of which priority benefits are claimed in an accompanying application data sheet, is in its entirety incorporated here by reference.

BACKGROUND

Technical Field

Certain embodiments of the present invention relate to an ion generator and an ion implanter.

Description of Related Art

In a semiconductor manufacturing process, a process of implanting ions into a semiconductor wafer (also referred to as an ion implantation process) is generally performed in order to change conductivity of a semiconductor, or in order to change a crystal structure of the semiconductor. The device used in this process is generally called an ion implanter. In such an ion implanter, an ion generator for converting a source gas into a plasma to generate ions is used. As the source gas, a vapor generated by heating a solid material containing an impurity element has been used in the related art.

SUMMARY

According to an embodiment of the present invention, there is provided anion generator including a vapor generating chamber for generating a vapor by heating a raw material in which a first solid material which is a single substance of an impurity element and a second solid material which is a compound containing the impurity element are mixed with each other, and a plasma generating chamber for a generating plasma containing ions of the impurity element by using the vapor.

According to another embodiment of the present invention, there is provided an ion implanter. The ion implanter includes the ion generator according to the aspect, and a beamline device that transports an ion beam of the impurity element extracted from the ion generator to a wafer.

DETAILED DESCRIPTION

When ions of a certain type of impurity element are acquired, if the ions need to be generated using a vapor generated by heating a single type of solid material, a beam current of the ion beam extracted from an ion generator and a lifetime of the ion generator are insufficient.

It is desirable to provide a technique for improving performance of the ion generator in which the vapor generated by heating the solid material is used as a raw material.

Any desired combination of the above-described configuration elements, and those in which the configuration elements or expressions according to the present invention are substituted from each other in methods, devices, or systems are effectively applicable as an aspect of the present invention.

According to the embodiments of the present invention, it is possible to improve the performance of the ion generator in which the vapor generated by heating the solid material is used as the source gas.

Hereinafter, embodiments according to the present invention will be described in detail with reference to the drawings. In describing the drawings, the same reference numerals will be assigned to the same elements, and repeated description will be appropriately omitted. Configurations described below are merely examples, and do not limit the scope of the present invention in any way.

Before the embodiments are described in detail, an outline will be described. The present embodiment relates to an ion implanter including an ion generator. The ion generator includes a vapor generating chamber for heating a raw material which is a solid material to generate a vapor, and a plasma generating chamber for generating a plasma containing ions of an impurity element by using the vapor. As the raw material for generating the vapor, the present embodiment adopts a raw material in which a first solid material which is a single substance of an impurity element and a second solid material which is a compound containing the impurity element are mixed with each other. Two types of solid materials are mixed with each other, and are used as the raw material. In this manner, a beam current of the ion beam that can be extracted from the ion generator can be increased, and the lifetime of the ion generator can be improved.

Figure 1:
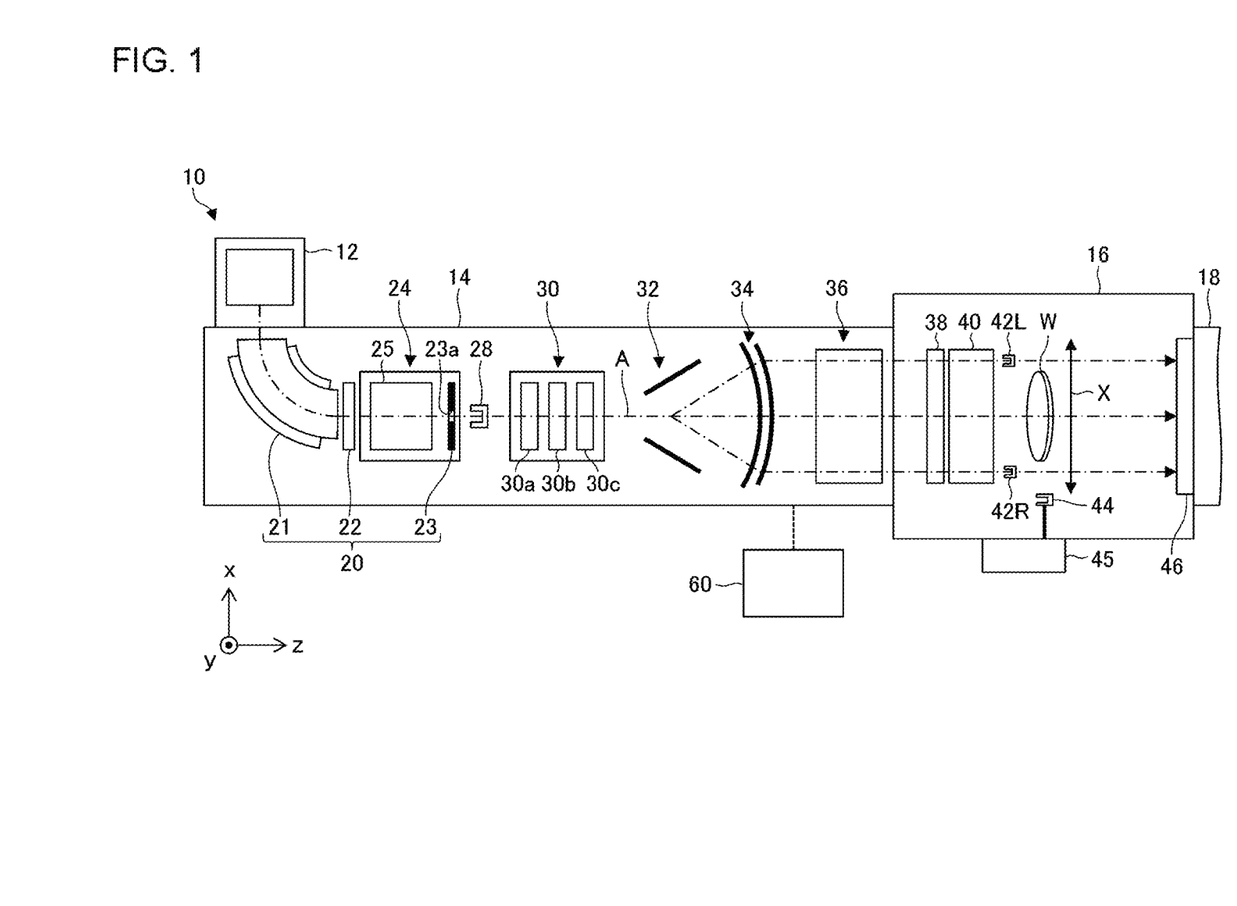
FIG. 1 is a top view illustrating a schematic configuration of an ion implanter according to an embodiment.
Figure 2:
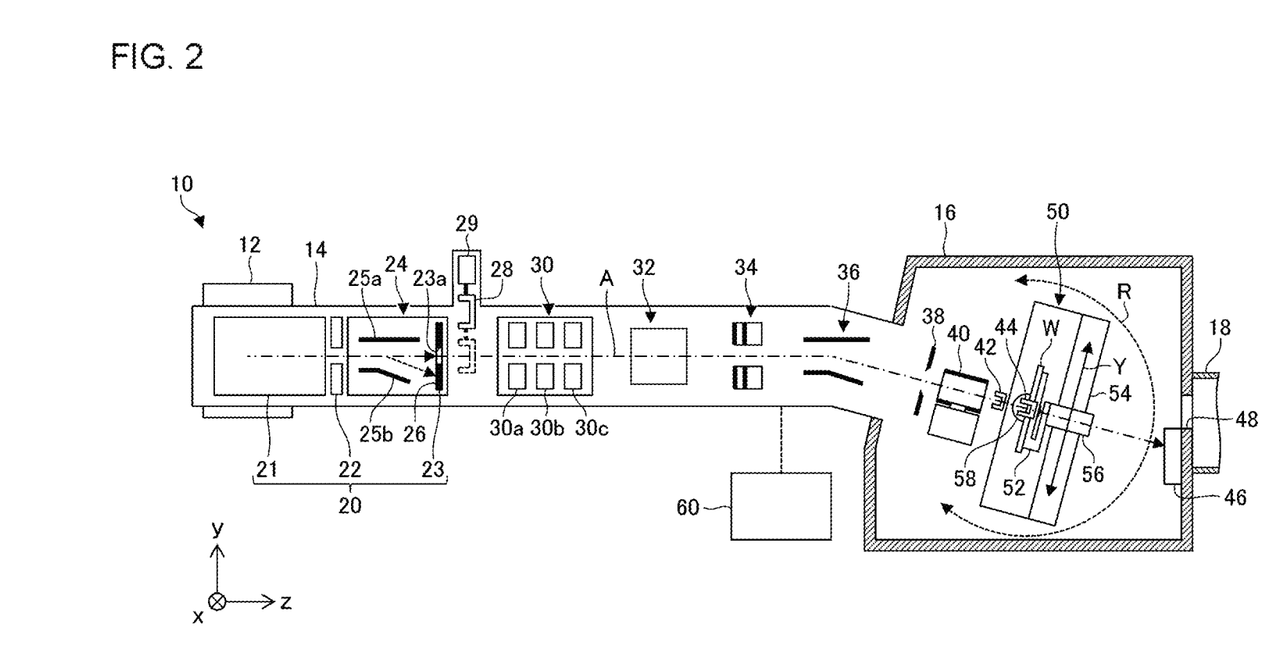
FIG. 2 is a side view illustrating a schematic configuration of the ion implanter in FIG. 1.

FIG. 1 is a top view schematically illustrating an ion implanter 10 according to an embodiment, and FIG. 2 is a side view illustrating a schematic configuration of the ion implanter 10. The ion implanter 10 is configured to perform an ion implantation process on a surface of a workpiece W. For example, the workpiece W is a substrate, and is a semiconductor wafer. For convenience of description, the workpiece W may be referred to as a wafer W in the specification herein. However, this is not intended to limit an implantation processing target to a specific object.

The ion implanter 10 is configured to irradiate a whole processing surface of the wafer W with the ion beam by performing reciprocating scanning using the ion beam in one direction and causing the wafer W to reciprocate in a direction perpendicular to the scanning direction. In the specification herein, for convenience of description, a traveling direction of the ion beam traveling along a designed beamline A is defined as a z-direction, and a plane perpendicular to the z-direction is defined as an xy-plane. In a case where the workpiece W is scanned with the ion beam, the scanning direction of the beam is defined as an x-direction, and a direction perpendicular to the z-direction and the x-direction is defined as a y-direction. Therefore, the reciprocating scanning using the beam is performed in the x-direction, and the wafer W reciprocates in the y-direction.

The ion implanter 10 includes an ion generator 12, a beamline device 14, an implantation processing chamber 16, and a wafer transfer device 18. The ion generator 12 is configured to provide the ion beam for the beamline device 14. The beamline device 14 is configured to transport the ion beam from the ion generator 12 to the implantation processing chamber 16. The implantation processing chamber 16 accommodates the wafer W serving as an implantation target, and an implantation process of irradiating the wafer W with the ion beam provided from the beamline device 14 is performed in the implantation processing chamber 16. The wafer transfer device 18 is configured to load an unprocessed wafer before the implantation process into the implantation processing chamber 16, and unload a processed wafer after the implantation process from the implantation processing chamber 16. The ion implanter 10 includes a vacuum system (not illustrated) for providing a desired vacuum environment for the ion generator 12, the beamline device 14, the implantation processing chamber 16, and the wafer transfer device 18.

The beamline device 14 includes a mass analyzing unit 20, a beam park device 24, a beam shaping unit 30, a beam scanning unit 32, a beam parallelizing unit 34, and an angular energy filter (AEF) 36, in order from an upstream side of a beamline A. The upstream region of the beamline A means a side closer to the ion generator 12, and a downstream region of the beamline A means a side closer to the implantation processing chamber 16 (or a beam stopper 46).

The mass analyzing unit 20 is disposed downstream of the ion generator 12, and is configured to select a required ion species from the ion beam extracted from the ion generator 12 by performing mass analyzing. The mass analyzing unit 20 has a mass analyzing magnet 21, a mass analyzing lens 22, and a mass analyzing slit 23.

The mass analyzing magnet 21 applies a magnetic field to the ion beam extracted from the ion generator 12, and deflects the ion beam to travel in a specific path in accordance with a value of the mass-to-charge ratio $M=m/q$ (here, m is mass, and q is charge) of the ions. For example, the mass analyzing magnet 21 applies the magnetic field in the y-direction (−y-direction in FIGS. 1 and 2) to the ion beam so that the ion beam is deflected in the x-direction. Strength of the magnetic field of the mass analyzing magnet 21 is adjusted so that the ion species having a desired mass-to-charge ratio M passes through the mass analyzing slit 23.

The mass analyzing lens 22 is disposed downstream of the mass analyzing magnet 21, and is configured to adjust focusing/defocusing power for the ion beam. The mass analyzing lens 22 adjusts a focusing position of the ion beam passing through the mass analyzing slit 23 in a beam traveling direction (z-direction), and adjusts a mass resolution M/dM of the mass analyzing unit 20. The mass analyzing lens 22 is not an essential component, and the mass analyzing unit 20 need not have the mass analyzing lens 22.

The mass analyzing slit 23 is disposed downstream of the mass analyzing lens 22, and is disposed at a position away from the mass analyzing lens 22. The mass analyzing slit 23 is configured so that a beam deflection direction (x-direction) by the mass analyzing magnet 21 is a slit width direction, and has an opening 23a that is relatively short in the x-direction and relatively long in the y-direction.

The mass analyzing slit 23 may be configured so that the slit width is variable for adjusting the mass resolution. The mass analyzing slit 23 may be configured by two blockade bodies that are movable in the slit width direction, and may be configured so that the slit width is adjustable by changing an interval between the two blockade bodies. The mass analyzing slit 23 may be configured so that the slit width is variable by selecting any one of a plurality of slits having different slit widths.

The beam park device 24 is configured to cause the ion beam to temporarily retreat from the beamline A and to temporarily block the ion beam directed to the implantation processing chamber 16 (or the wafer W) located downstream. The beam park device 24 can be disposed at any desired position in an intermediate portion of the beamline A. For example, the beam park device 24 can be disposed between the mass analyzing lens 22 and the mass analyzing slit 23. A prescribed distance is required between the mass analyzing lens 22 and the mass analyzing slit 23. Accordingly, the beam park device 24 is disposed between both of them. In this manner, a length of the beamline A can be shortened, compared to a case where the beam park device 24 is disposed at another position. Therefore, the whole ion implanter 10 can be reduced in size.

The beam park device 24 includes a pair of park electrodes 25 (25a and 25b) and a beam dump 26. The pair of park electrodes 25a and 25b faces each other across the beamline A, and faces in a direction (y-direction) perpendicular to the beam deflection direction (x-direction) of the mass analyzing magnet 21. The beam dump 26 is disposed on the downstream side of the beamline A than the park electrodes 25a and 25b, and is disposed away from the beamline A in a facing direction of the park electrodes 25a and 25b.

The first park electrode 25a is disposed on an upper side of the beamline A in a direction of gravity, and the second park electrode 25b is disposed on a lower side of the beamline A in the direction of gravity. The beam dump 26 is disposed at a position away to the lower side of the beamline A in the direction of gravity, and is disposed on the lower side of the opening 23a of the mass analyzing slit 23 in the direction of gravity. For example, the beam dump 26 is configured to include a portion of the mass analyzing slit 23 where the opening 23a is not formed. The beam dump 26 maybe configured to be separate from the mass analyzing slit 23.

The beam park device 24 deflects the ion beam by using an electric field applied between the pair of park electrodes 25a and 25b, and causes the ion beam to retreat from the beamline A. For example, a negative voltage is applied to the second park electrode 25b, based on a potential of the first park electrode 25a. In this manner, the ion beam is deflected downward from the beamline A in the direction of gravity, and is incident into the beam dump 26. In FIG. 2, a trajectory of the ion beam directed toward the beam dump 26 is indicated by a dashed line. The beam park device 24 causes the ion beam to pass toward the downstream side along the beamline A by setting the pair of park electrodes 25a and 25b to have the same potential. The beam park device 24 is configured to be operable by switching between a first mode in which the ion beam passes to the downstream side and a second mode in which the ion beam is incident into the beam dump 26.

An injector Faraday cup 28 is disposed downstream of the mass analyzing slit 23. The injector Faraday cup 28 is configured to be movable into and out of the beamline A by an operation of an injector driving unit 29. The injector driving unit 29 moves the injector Faraday cup 28 in a direction (for example, the y-direction) perpendicular to an extending direction of the beamline A. In a case where the injector Faraday cup 28 is disposed on the beamline A as illustrated by a dashed line in FIG. 2, the injector Faraday cup 28 blocks the ion beam directed toward the downstream side. On the other hand, as illustrated by a solid line in FIG. 2, in a case where the injector Faraday cup 28 is
retreat from the beamline A, the blocking of the ion beam directed toward the downstream side is released.

The injector Faraday cup 28 is configured to measure a beam current of the ion beam subjected to mass analyzing by the mass analyzing unit 20. The injector Faraday cup 28 can measure a mass analyzing spectrum of the ion beam by measuring the beam current while changing the strength of the magnetic field of the mass analyzing magnet 21. The mass resolution of the mass analyzing unit 20 can be calculated using the measured mass analyzing spectrum.

The beam shaping unit 30 includes a focusing/defocusing device such as a focusing/defocusing quadrupole lens (Q-lens), and is configured to shape the ion beam having passed through the mass analyzing unit 20 to have a desired cross-sectional shape. For example, the beam shaping unit 30 is configured to include an electric field type three-stage quadrupole lens (also referred to as a triplet Q-lens), which has three quadrupole lenses 30a, 30b, and 30c. The beam shaping unit 30 adopts the three lens devices 30a to 30c. Accordingly, the beam shaping unit 30 can adjust the ion beam to converge or diverge independently in the x-direction and the y-direction, respectively. The beam shaping unit 30 may include a magnetic field type lens device, or may include a lens device that shapes the beam by using both an electric field and a magnetic field.

The beam scanning unit 32 is a beam deflection device configured to provide reciprocating scanning using the beam and to perform scanning using the shaped ion beam in the x-direction. The beam scanning unit 32 has a scanning electrode pair facing in a beam scanning direction (x-direction). The scanning electrode pair is connected to a variable voltage power supply (not illustrated), and a voltage applied between the scanning electrode pair is periodically changed. In this manner, an electric field generated between the electrodes is changed so that the ion beam is deflected at various angles. As a result, a whole scanning range is scanned with the ion beam in the x-direction. In FIG. 1, the scanning direction and the scanning range of the ion beam are indicated by an arrow X, and a plurality of trajectories of the ion beam in the scanning range are indicated by a one dot chain line.

The beam parallelizing unit 34 is configured so that the traveling direction of the ion beam used for the scanning becomes parallel to the trajectory of the designed beamline A. The beam parallelizing unit 34 has a plurality of arc-shaped parallelizing lens electrodes in which an ion beam passing slit is disposed in a central portion in the y-direction. The parallelizing lens electrode is connected to a high-voltage power supply (not illustrated), and applies an electric field generated by voltage application to the ion beam so that the traveling directions of the ion beams are parallelized. The beam parallelizing unit 34 may be replaced with another beam parallelizing device, and the beam parallelizing device may be configured to serve as a magnet device using a magnetic field.

An acceleration/deceleration (A/D) column (not illustrated) for accelerating or decelerating the ion beam may be disposed downstream of the beam parallelizing unit 34.

The angular energy filter (AEF) 36 is configured to analyze energy of the ion beam, to deflect ions having necessary energy downward, and to guide the ions to the implantation processing chamber 16. The angular energy filter 36 has an AEF electrode pair for electric field deflection. The AEF electrode pair is connected to a high-voltage power supply (not illustrated). In FIG. 2, the ion beam is deflected downward by applying a positive voltage to the upper AEF electrode and applying a negative voltage to the lower AEF electrode. The angular energy filter 36 may be configured to include a magnet device for magnetic field deflection, or may be configured to include a combination between the AEF electrode pair for electric field deflection and the magnet device for magnetic field deflection.

In this way, the beamline device 14 supplies the ion beam to be used for irradiating the wafer W to the implantation processing chamber 16.

The implantation processing chamber 16 includes an energy slit 38, a plasma shower device 40, side cups 42, a center cup 44, and a beam stopper 46, in order from the upstream side of the beamline A. As illustrated in FIG. 2, the implantation processing chamber 16 includes a platen driving device 50 that holds one or more wafers W.

The energy slit 38 is disposed on the downstream side of the angular energy filter 36, and analyzes the energy of the ion beam incident into the wafer W together with the angular energy filter 36. The energy slit 38 is an energy defining slit (EDS) configured to include a slit that is horizontally long in the beam scanning direction (x-direction). The energy slit 38 causes the ion beam having a desired energy value or a desired energy range to pass toward the wafer W, and blocks the other ion beams.

The plasma shower device 40 is located on the downstream side of the energy slit 38. The plasma shower device 40 supplies low-energy electrons to the ion beam and a surface of the wafer W (wafer processing surface) in accordance with a beam current amount of the ion beam, and suppresses an accumulation of positive charges on the wafer processing surface which are induced by ion implantation. For example, the plasma shower device 40 includes a shower tube through which the ion beam passes, and a plasma generating device that supplies electrons into the shower tube.

The side cups 42 (42L and 42R) are configured to measure the beam current of the ion beam during a process of implanting the ions into the wafer W. As illustrated in FIG. 2, the side cups 42L and 42R are disposed to be shifted to the left and right (x-direction) with respect to the wafer W disposed on the beamline A, and are disposed at a position where the side cups 42L and 42R do not block the ion beam directed toward the wafer W during the ion implantation. The ion beam is used for scanning in the x-direction beyond a range where the wafer W is located. Accordingly, a portion of the beam for the scanning is incident into the side cups 42L and 42R even during the ion implantation. In this manner, the beam current amount during the ion implantation process is measured by the side cups 42L and 42R.

The center cup 44 is configured to measure the beam current on the wafer processing surface. The center cup 44 is configured to be movable by an operation of a driving unit 45, is retreated from an implantation position where the wafer W is located during the ion implantation, and is inserted into the implantation position when the wafer W is not located at the implantation position. The center cup 44 measures the beam current while moving in the x-direction. In this manner, the center cup 44 can measure the beam current over the whole beam scanning range in the x-direction. In the center cup 44, a plurality of Faraday cups may be aligned in the x-direction to be formed in an array shape so that the beam currents can be simultaneously measured at a plurality of positions in the beam scanning direction (x-direction).

At least one of the side cups 42 and the center cup 44 may include a single Faraday cup for measuring a beam current amount, or may include an angle measurement device for measuring angle information of the beam. For example, the angle measurement device includes a slit and a plurality of current detectors disposed away from the slit in the beam traveling direction (z-direction). For example, the angle measurement device can measure an angle component of the beam in the slit width direction by causing the plurality of current detectors aligned in the slit width direction to measure the beam having passed through the slit. At least one of the side cups 42 and the center cup 44 may include a first angle measurement device capable of measuring angle information in the x-direction and a second angle measurement device capable of measuring angle information in the y-direction.

The platen driving device 50 includes a wafer holding device 52, a reciprocating mechanism 54, a twist angle adjusting mechanism 56, and a tilt angle adjusting mechanism 58. The wafer holding device 52 includes an electrostatic chuck for holding the wafer W. The reciprocating mechanism 54 causes the wafer holding device 52 to reciprocate in a reciprocating direction (y-direction) perpendicular to the beam scanning direction (x-direction). In this manner, the wafer held by the wafer holding device 52 is caused to reciprocate in the reciprocating direction (y-direction). In FIG. 2, a reciprocating movement of the wafer W is indicated by an arrow Y.

The twist angle adjusting mechanism 56 adjusts a rotation angle of the wafer W. The twist angle adjusting mechanism 56 rotates the wafer W around a normal line of the wafer processing surface as a rotation center axis. In this manner, the twist angle adjusting mechanism 56 adjusts a twist angle between an alignment mark disposed on an outer peripheral portion of the wafer and a reference position. Here, the alignment mark of the wafer means a notch or an orientation flat disposed on the outer peripheral portion of the wafer, and means a mark that serves as a reference for a crystal axis direction of the wafer or an angular position in a circumferential direction of the wafer. The twist angle adjusting mechanism 56 is disposed between the wafer holding device 52 and the reciprocating mechanism 54, and is caused to reciprocate together with the wafer holding device 52.

The tilt angle adjusting mechanism 58 adjusts tilting of the wafer W, and adjusts a tilt angle between the traveling direction of the ion beam directed toward the wafer processing surface and the normal line of the wafer processing surface. In the present embodiment, out of the tilt angles of the wafer W, an angle with respect to which the axis in the x-direction is a rotation center axis is adjusted as the tilt angle. The tilt angle adjusting mechanism 58 is disposed between the reciprocating mechanism 54 and an inner wall of the implantation processing chamber 16, and rotates the whole platen driving device 50 including the reciprocating mechanism 54 in an R-direction. In this manner, the tilt angle adjusting mechanism 58 is configured to adjust the tilt angle of the wafer W.

The platen driving device 50 holds the wafer W so that the wafer W is movable between an implantation position where the wafer W is irradiated with the ion beam and a transfer position where the wafer W is loaded or unloaded between the platen driving device 50 and the wafer transfer device 18. FIG. 2 illustrates a state where the wafer W is located at the implantation position, and the platen driving device 50 holds the wafer W so that the beamline A and the wafer W intersect each other. The transfer position of the wafer W corresponds to a position of the wafer holding device 52 when the wafer W is loaded or unloaded through a transfer port 48 by a transfer mechanism or a transfer robot disposed in the wafer transfer device 18.

The beam stopper 46 is disposed on the most downstream side of the beamline A, and is mounted on the inner wall of the implantation processing chamber 16, for example. In a case where the wafer W does not exist on the beamline A, the ion beam is incident into the beam stopper 46. The beam stopper 46 is located close to the transfer port 48 that connects the implantation processing chamber 16 and the wafer transfer device 18 to each other, and is disposed at a position vertically below the transfer port 48.

Figure 3:
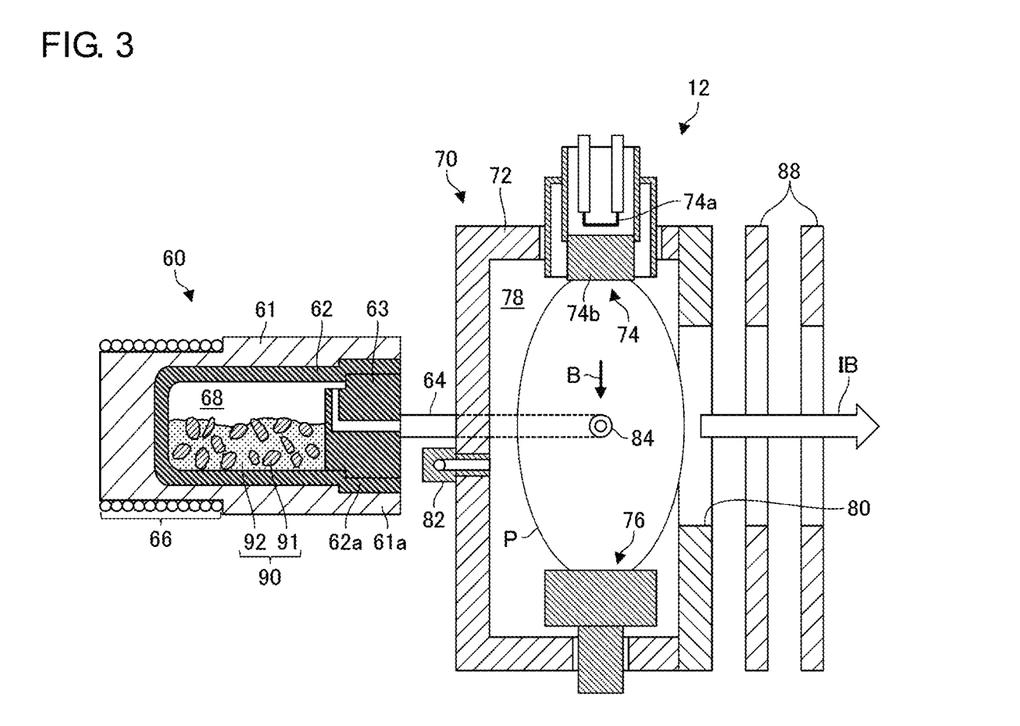
FIG. 3 is a sectional view schematically illustrating a configuration of an ion generator according to the embodiment.

FIG. 3 is a sectional view schematically illustrating a configuration of the ion generator 12 according to the embodiment. The ion generator 12 includes a vapor generator 60 and a plasma generator 70. The vapor generator 60 generates a vapor containing an impurity element serving as a source of an ion beam IB, and supplies the generated vapor to the plasma generator 70. The plasma generator 70 ionizes the vapor supplied from the vapor generator 60, and generates a plasma P containing ions of the impurity element. The ions generated by the plasma generator 70 are extracted by an extraction electrode 88 as the ion beam IB.

The vapor generator 60 includes an outer container 61, an inner container 62, a lid 63, and a heating wire 66. The inner container 62 and the lid 63 define a vapor generating chamber 68 for generating the vapor by heating a raw material 90. The outer container 61 and the inner container 62 have a double cylindrical structure, and the inner container 62 is fitted into the outer container 61. The lid 63 is attached to an opening end 62a of the inner container 62, and is configured to close the vapor generating chamber 68. The lid 63 has a vapor introduction pipe 64. The vapor introduction pipe 64 guides the vapor generated in the vapor generating chamber 68 to the plasma generator 70.

The inner container 62 is attachable to and detachable from the outer container 61. For example, a male screw is formed on an outer peripheral surface of the opening end 62a of the inner container 62, and a female screw is formed on an inner peripheral surface of an opening end 61a of the outer container 61. Threaded structures thereof engage with each other. The lid 63 is attachable to and detachable from the inner container 62. For example, a female screw is formed on an inner peripheral surface of the opening end 62a of the inner container 62, and a male screw is formed on an outer peripheral surface of the lid 63. Threaded structures thereof engage with each other.

For example, the outer container 61 is formed of a metal material such as stainless steel. For example, the inner container 62 and the lid 63 are formed of graphite. In a case where the inner container 62 and the lid 63 are formed of graphite, it is possible to prevent a possibility that the lid 63 may be difficult to be opened since the heated raw material 90 may stick to the threaded structures of the inner container 62 and the lid 63. The inner container 62 functions as a liner configuring an inner surface that comes into contact with the raw material 90 in the vapor generating chamber 68.

The heating wire 66 is disposed outside the outer container 61, and is wound around the outer peripheral surface of the outer container 61, for example. The outer container 61 is heated by feeding a current to the heating wire 66, and the inner container 62 is heated by raising a temperature of the outer container 61. In this manner, the vapor generating chamber 68 is heated to approximately 200° C. to 1,000° C. The raw material 90 heated in the vapor generating chamber 68 is vaporized into the vapor, and is supplied to the plasma generator 70 through the vapor introduction pipe 64.

The plasma generator 70 includes an arc chamber 72, a cathode 74, and a repeller 76. The arc chamber 72 has a substantially rectangular parallelepiped box shape. The arc chamber 72 defines the plasma generating chamber 78 where the plasma P is generated. A slit 80 for extracting the ion beam IB is disposed on a front side of the arc chamber 72. The slit 80 has an elongated shape extending in a direction from the cathode 74 toward the repeller 76.

The cathode 74 emits thermal electrons into the plasma generating chamber 78. The cathode 74 is a so-called indirectly heated cathode (IHC), and has a filament 74a and a cathode head 74b. The cathode head 74b is heated by primary thermal electrons generated from the filament 74a, and supplies secondary thermal electrons into the plasma generating chamber 78. The cathode 74 may be a so-called directly heated cathode.

The repeller 76 is disposed at a position facing the cathode 74. The repeller 76 repels thermal electrons supplied into the plasma generating chamber 78, and causes the thermal electrons to stay in the plasma generating chamber 78, thereby improving efficiency in generating the plasma.

A gas introduction port 82 and a vapor introduction port 84 are disposed on a side wall of the arc chamber 72. The gas introduction port 82 supplies an assist gas into the plasma generating chamber 78 from a gas cylinder (not illustrated). For example, the gas introduction port 82 is disposed at a position opposite to the slit 80 across the plasma generating chamber 78. The vapor introduction port 84 supplies the vapor generated by the vapor generator 60 into the plasma generating chamber 78. For example, the vapor introduction port 84 is disposed on a side wall of the arc chamber 72 which is different from the side wall having the slit 80 and the gas introduction port 82.

A magnetic field B is applied to the plasma generating chamber 78 in the direction from the cathode 74 toward the repeller 76. The thermal electrons supplied into the plasma generating chamber 78 are restrained by the magnetic field B applied to the plasma generating chamber 78, and move spirally along the magnetic field B. The electrons are spirally moved in the plasma generating chamber 78. In this manner, the efficiency in generating the plasma can be improved.

In the present embodiment, the ion generator 12 is used to generate the ion beam IB of aluminum (Al). In the related art, in a case where an Al ion beam is generated, any one of solid materials such as pure aluminum (metal aluminum), aluminum trifluoride ($AlF_3$), and aluminum nitride (AlN) has been used alone as a raw material. However, in a case where the solid material is used alone, a beam current of the Al ion beam and a lifetime of the ion generator are insufficient. The present inventor has found the following. When the raw material 90 in which two types of solid materials are mixed with each other is used, both the beam current of the Al ion beam IB and the lifetime of the ion generator 12 can be improved.

The raw material 90 filling the vapor generating chamber 68 of the vapor generator 60 includes a first solid material 91 and a second solid material 92. The first solid material 91 is a single substance of the impurity element, and is pure aluminum, for example. The second solid material 92 is a compound of the impurity element, and is a halogen compound of aluminum ($AlF_3$, $AlCl_3$, $AlBr_3$, $AlI_3$), for example. In view of easy handling, it is preferable that the second solid material 92 is a fluorine compound of aluminum ($AlF_3$).

The first solid material 91 has a granulated powder shape, a granular shape, a shot shape, or a bulk shape. On the other hand, the second solid material 92 has a powder shape, granulated powder shape, or granular shape. Here, the powder shape, the granulated powder shape, the granular shape, the shot shape, and the bulk shape are defined by a particle size of the solid material. The powder shape indicates a particle size of 0.1 mm or smaller, the granulated powder shape indicates a particle size of approximately 0.1 mm to 1 mm, the granular shape indicates a particle size of approximately 1 mm to 5 mm, the shot shape indicates a particle size of approximately 5 mm to 10 mm, and the bulk shape indicates a particle size larger than 10 mm. Therefore, the particle size of the first solid material 91 is 0.1 mm or larger, and the particle size of the second solid material 92 is 5 mm or smaller.

A weight ratio of the first solid material 91 contained in the raw material 90 can be set to 5% to 95%, 25% to 75%, or 40% to 60%. Similarly, a weight ratio of the second solid material 92 contained in the raw material 90 can be set to 5% to 95%, 25% to 75%, or 40% to 60%. As an example, each weight ratio of the first solid material 91 and the second solid material 92 is approximately 50%.

In a case where the first solid material 91 is Al and the second solid material 92 is $AlF_3$, a heating temperature of the vapor generating chamber 68 may be set to approximately 500° C. to 1,000° C. As an example, the heating temperature of the vapor generating chamber 68 is preferably set to approximately 700° C. to 850° C. For example, the heating temperature may be set to 800° C.

It is preferable that not only the vapor containing Al is supplied from the vapor generator 60 but also the assist gas is supplied from the gas introduction port 82 to the plasma generator 70. By using the assist gas, the plasma can be stably generated in the plasma generating chamber 78, compared to a case where the assist gas is not used. By adjusting a supply amount of the assist gas, density of the plasma generated in the plasma generating chamber 78 can be controlled, and the beam current of the ion beam IB extracted from the plasma generator 70 can be easily changed. Furthermore, depending on a type of the assist gas, dirt can be prevented from adhering to the inner surface of the arc chamber 72, and the lifetime of the plasma generator 70 can be improved. In particular, by using the fluoride gas as the assist gas, the dirt can be suitably prevented from adhering to the inner surface of the arc chamber 72.

The assist gas is composed of a single substance or a compound of an element different from the impurity element to be extracted as the ion beam IB. For example, the assist gas is noble gas, hydrogen compound gas, or halogen compound gas. For example, as the assist gas, it is possible to use nitrogen ($N_2$), neon (Ne), argon (Ar), xenon (Xe), arsine ($A_sH_3$), phosphine ($PH_3$), boron trifluoride ($BF_3$), phosphorus trifluoride ($PF_3$), or arsenic trifluoride ($A_sF_3$).

Next, examples of embodiments of the invention will be described. In Example 1, as the first solid material 91, aluminum having a granular shape (particle size of approximately 2 to 3 mm) is used. As the second solid material 92, aluminum trifluoride having a powder shape or a granulated powder shape (particle size of approximately 0.1 mm to 0.5 mm) is used. Each weight ratio of the first solid material 91 and the second solid material 92 is set to 50%. Boron trifluoride is used as the assist gas. In a case where an extraction voltage applied by the extraction electrode 88 is 10 kV to 90 kV, a beam of singly charged aluminum ions ($Al^+$), current of which is approximately 5 mA, can be continuously obtained for 100 hours. When the beam current of the beam of singly charged aluminum ions ($Al^+$) is approximately 1 mA, the ion can be continuously obtained for 300 hours. Doubly charged aluminum ions ($Al^{2+}$) or triply charged aluminum ions ($Al^{3+}$) can also be acquired.

Example 2 has the same condition as that of Example 1 except that an argon gas is used as the assist gas. In Example 2, a beam of singly charged aluminum ions ($Al^+$), current of which is approximately 1 mA, can be obtained at the maximum. Example 3 has the same condition as those of Examples 1 and 2 except that phosphine is used as the assist gas. In Example 3, the beam of singly charged aluminum ions ($Al^+$), current of which is approximately 1 mA, can also be obtained at the maximum. Example 4 has the same condition as those of Examples 1 to 3 except that the assist gas is not used. In Example 4, the beam of singly charged aluminum ions ($Al^+$), current of which is approximately 1 mA, can also be obtained at the maximum. However, it is found that stability of the plasma tends to be degraded.

On the other hand, in Comparative Example 1 where pure aluminum alone is used as the raw material, only the beam of singly charged aluminum ions ($Al^+$), current of which is approximately 0.2 mA, can be obtained at the maximum. In Comparative Example 2 where only aluminum trifluoride is used as the raw material, only the beam of singly charged aluminum ions ($Al^+$), current of which is approximately 0.5 mA, can be obtained at the maximum. In Comparative Example 1 and Comparative Example 2, the assist gases such as Ar, $BF_3$, or $PH_3$ are used.

As described above, two types of solid materials are used by being mixed with each other. In this manner, compared to a case where one type of solid materials is used alone, it is possible to increase the maximum value of the obtained beam current. In addition, in this manner, the ion beam having a high current can be continuously extracted for 100 hours or 300 hours. Even in a case where the beam current is 1 mA or higher, the lifetime of the ion generator 12 can be extended. In general, the beam current and the lifetime are in a reciprocal relationship. The lifetime tends to be shortened as the beam current increases.

Details of a mechanism are not clear which increases the beam current of the ion beam that can be extracted from the plasma generator 70 by mixing two types of solid materials. As a hypothesis of the inventor, it is conceivable to be the following. An intermediate compound containing the impurity element is generated in the vapor generating chamber 68 by mixing and heating the two types of solid materials. The vapor containing the intermediate compound is supplied from the vapor generator 60 to the plasma generator 70. In this manner, the amount of the impurity element contained in the vapor increases compared to a case where a single solid material is used alone. Ina case where pure aluminum and aluminum trifluoride are used, the vapor containing intermediate compound such as AlF and $AlF_2$ is supplied to the plasma generator 70 after being generated in the vapor generator 60.

According to the present embodiment, the assist gas is used together. In this manner, the plasma is more stably generated in the plasma generator 70, and the ions of the impurity element can be efficiently generated. In a case where a metal element such as aluminum is used as the raw material, a mean free path of the ions is relatively short. Accordingly, even if the metal element is ionized, the ion of the metal element is likely to return to a stable metal state. Therefore, there is a tendency that the ions are not likely to be continuously and stably generated. On the other hand, according to the present embodiment, the assist gas is used together. Accordingly, the metal element such as aluminum can be ionized by using the plasma of the assist gas, and an ionized state of the metal element can be easily maintained. As a result, more ions of the impurity element can be extracted from the plasma generator 70, and the beam current of the extracted ion beam IB can be increased.

According to the present embodiment, the assist gas is used together. In this manner, the temperature of the arc chamber 72 can be maintained at a high temperature of approximately 700° C. to 2,000° C. In particular, in a case where $BF_3$ is used as the assist gas, the temperature of the arc chamber 72 can be set to approximately 2,000° C. As a result, the dirt adhering to the inner surface of the arc chamber 72 can be sublimated under a high-temperature environment, and the dirt can be prevented from adhering to the arc chamber 72. The substance such as Al or $AlF_x$, which contains the impurity element and adheres to the inner surface of the arc chamber 72, is sublimated, and is ionized again in the plasma generating chamber 78. In this manner, much more ions of the impurity element can be generated.

According to the present embodiment, the assist gas is used together. Accordingly, the beam current can be easily adjusted. Specifically, a flow rate of the assist gas is controlled. In this manner, the beam current of the Al ion beam can be stably adjusted in a range of 0.1 mA to 5 mA.

For example, the Al ion beam generated according to the present embodiment can be used for the ion implantation process in which the Al ions are implanted into a silicon carbide (SiC) semiconductor.

Hitherto, the present invention has been described with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, the processing sequences can be appropriately rearranged, or various modifications such as design changes can be added to the embodiment. The embodiment having the alterations can also be included in the scope of the present invention.

In the above-described embodiments, cases have been described where the impurity element is Al. In another embodiment, another impurity element maybe used. For example, a raw material maybe used in which the first solid material and the second solid material which contain a metal element such as indium (In), antimony (Sb), gallium (Ga), tin (Sn), or magnesium (Mg) are mixed together.

In a case where the first solid material is pure indium, as the second solid material, it is possible to use indium trifluoride ($InF_3$), indium trichloride ($InCl_3$), indium tribromide ($InBr_3$), indiummonoiodide (InI), or indium triiodide ($InI_3$). The raw material in which the first solid material and the second solid material are mixed with each other is used. In this manner, an indium ion beam can be generated.

Ina case where the first solid material is pure antimony, as the second solid material, it is possible to use antimony trifluoride ($SbF_3$), antimony trichloride ($SbCl_3$), antimony tribromide ($SbBr_3$), or antimonytriiodide ($SbI_3$). The raw material in which the first solid material and the second solid material are mixed with each other is used. In this manner, an antimony ion beam can be generated.

In a case where the first solid material is pure gallium, as the second solid material, it is possible to use gallium trifluoride ($GaF_3$), gallium trichloride ($GaCl_3$), gallium tribromide ($GaBr_3$), or gallium triiodide ($GaI_3$). The raw material in which the first solid material and the second solid material are mixed with each other is used. In this manner, a gallium ion beam can be generated.

In a case where the first solid material is pure tin, as the second solid material, it is possible to use tin difluoride ($SnF_2$), tin tetrafluoride ($SnF_4$), tin dichloride ($SnCl_2$), tin dibromide ($SnBr_2$), tin diiodide ($SnI_2$), or tin tetraiodide ($SnI_4$). The raw material in which the first solid material and the second solid material are mixed with each other is used. In this manner, a tin ion beam can be generated.

In a case where the first solid material is pure magnesium, as the second solid material, it is possible to use magnesium difluoride (MgF$_2$), magnesium dichloride (MgCl$_2$), magnesium dibromide (MgBr$_2$), or magnesium diiodide (MgI$_2$). The raw material in which the first solid material and the second solid material are mixed with each other is used. In this manner, a magnesium ion beam can be generated.

It should be understood that the invention is not limited to the above-described embodiment, but may be modified into various forms on the basis of the spirit of the invention. Additionally, the modifications are included in the scope of the invention.

What is claimed is:

1. An ion generator comprising:
    a vapor generating chamber for generating a vapor by heating a raw material in which a first solid material which is a single substance of an impurity element and a second solid material which is a compound containing the impurity element are mixed with each other; and
    a plasma generating chamber for generating a plasma containing ions of the impurity element by using the vapor.
2. The ion generator according to claim 1, wherein the impurity element is metal.
3. The ion generator according to claim 2, wherein the impurity element is aluminum (Al).
4. The ion generator according to claim 1, wherein the second solid material is a halogen compound containing the impurity element.
5. The ion generator according to claim 4, wherein the second solid material is a fluorine compound containing the impurity element.
6. The ion generator according to claim 1, wherein the first solid material has a granulated powder shape, a granular shape, a shot shape, or a bulk shape, and
    wherein the second solid material has a powder shape, a granulated powder shape, or a granular shape.
7. The ion generator according to claim 1, wherein a weight percentage of the first solid material contained in the raw material is 5% to 95%, and a weight percentage of the second solid material contained in the raw material is 5% to 95%.
8. The ion generator according to claim 1, wherein an inner surface of the vapor generating chamber which comes into contact with the raw material is formed of graphite.
9. The ion generator according to claim 1, wherein a heating temperature of the raw material is 500° C. to 1,000° C. inside the vapor generating chamber.
10. The ion generator according to claim 1, further comprising:
    a gas introduction port that introduces an assist gas which is a single substance of an element different from the impurity element or a compound containing the element different from the impurity element, into the plasma generating chamber,
    wherein the plasma is generated inside the plasma generating chamber by using a mixed gas of the vapor and the assist gas.
11. The ion generator according to claim 10, wherein the assist gas is noble gas, hydrogen compound gas, or halogen compound gas.
12. The ion generator according to claim 11, wherein the assist gas is fluorine compound gas.
13. The ion generator according to claim 12, wherein the assist gas is boron trifluoride (BF$_3$) gas.
14. The ion generator according to claim 1, wherein the first solid material is aluminum, and the second solid material is aluminum trifluoride (AlF$_3$).
15. The ion generator according to claim 14, wherein an aluminum ion beam having a beam current of 5 mA or higher is extractable from the plasma generated inside the plasma generating chamber.
16. The ion generator according to claim 1, wherein an ion beam including multiply charged ions of the impurity element is extractable from the plasma generated inside the plasma generating chamber.
17. The ion generator according to claim 1, further comprising:
    an arc chamber defining the plasma generating chamber and having a slit for extracting an ion beam of the impurity element from the plasma generated inside the plasma generating chamber; and
    a cathode for generating the plasma by emitting thermal electrons into the arc chamber.
18. An ion implanter comprising:
    the ion generator according to claim 1; and
    a beamline device that transports an ion beam of the impurity element extracted from the ion generator, to a wafer.

* * * * *